(12) United States Patent
Dick (10) Patent No.: US 8,004,365 B2
(45) Date of Patent: Aug. 23, 2011

(54) AMPLIFIER CIRCUIT

(75) Inventor: Burkhard Dick, Hamburg (DE)

(73) Assignee: NXP B.V., Eindhoven (NL)

( * ) Notice: Subject to any disclaimer, the term of this patent is extended or adjusted under 35 U.S.C. 154(b) by 57 days.

(21) Appl. No.: 12/447,388

(22) PCT Filed: Oct. 15, 2007

(86) PCT No.: PCT/IB2007/054189
§ 371 (c)(1),
(2), (4) Date: Apr. 27, 2009

(87) PCT Pub. No.: WO2008/050259
PCT Pub. Date: May 2, 2008

(65) Prior Publication Data
US 2010/0045386 A1    Feb. 25, 2010

(30) Foreign Application Priority Data
Oct. 26, 2006 (EP) ................... 06122966

(51) Int. Cl.
*H03F 3/68* (2006.01)
(52) U.S. Cl. ................... 330/295; 330/252
(58) Field of Classification Search ........... 330/252, 330/261, 253, 295
See application file for complete search history.

(56) References Cited

U.S. PATENT DOCUMENTS

| 4,277,756 | A  | * | 7/1981 | Kriedt et al. | ............... 330/261 |
| 6,504,403 | B2 |   | 1/2003 | Banks et al. | |
| 7,057,457 | B2 | * | 6/2006 | Irvine et al. | ............... 330/252 |
| 2001/0004219 | A1 |   | 6/2001 | Bangs et al. | |
| 2005/0068106 | A1 |   | 3/2005 | Irvine | |

FOREIGN PATENT DOCUMENTS

| DE | 19736900 A1 | 3/1999 |
| EP | 0893880 A1 | 1/1999 |
| WO | 03/005566 A | 1/2003 |

* cited by examiner

*Primary Examiner* — Khanh V Nguyen (57) ABSTRACT

The invention relates to a circuit arrangement (30, 40, 70, 80, 90) of a low-noise linear input amplifier comprising a parallel circuit of a common-base circuit (20) and a common-emitter circuit (30), the emitters of two first transistors (Q3, Q4) are interlinked and the bases of two second transistors (Q1, Q2) are intercoupled, the collectors are interconnected in parallel with the output, and the source voltage (VG) is interlinked with the emitters of the second transistors (Q1, Q2) and with the bases of the first transistors (Q3, Q4), in which a linearization of the output current (OUTLNA1,2) as a function of the source voltage (VG) is achieved by a linearization of the transfer function, such as the tangential hyperbolic function, of the first and second transistors (Q1, Q2, Q3, Q4).

9 Claims, 9 Drawing Sheets

AMPLIFIER CIRCUIT

FIELD OF THE INVENTION

The invention relates to an amplifier circuit, more particularly a circuit arrangement for a preferably low-noise linear input amplifier. Such input amplifiers are preferably suitable for sources having a defined generator resistance, which have strict requirements as to the noise factor, linearity and gain.

STATE OF THE ART

Sources having a defined output voltage or generator voltage are for example ceramic or quartz filters, which are designed for a certain frequency and work as bandpass filters. This frequency may be, for example, around 10.7 MHz. In order to obtain a specified bandpass transfer function with such an example, the internal resistance of the input amplifier is usually to be adapted to the output resistance of the filter. As a rule, what is called power matching is further carried out, that is to say, the input resistance is then equal to the generator resistance. The generator resistance, however, need not of necessity be the output resistance of a filter, but may also be the resistance or impedance of, for example, an antenna.

Figure 1:
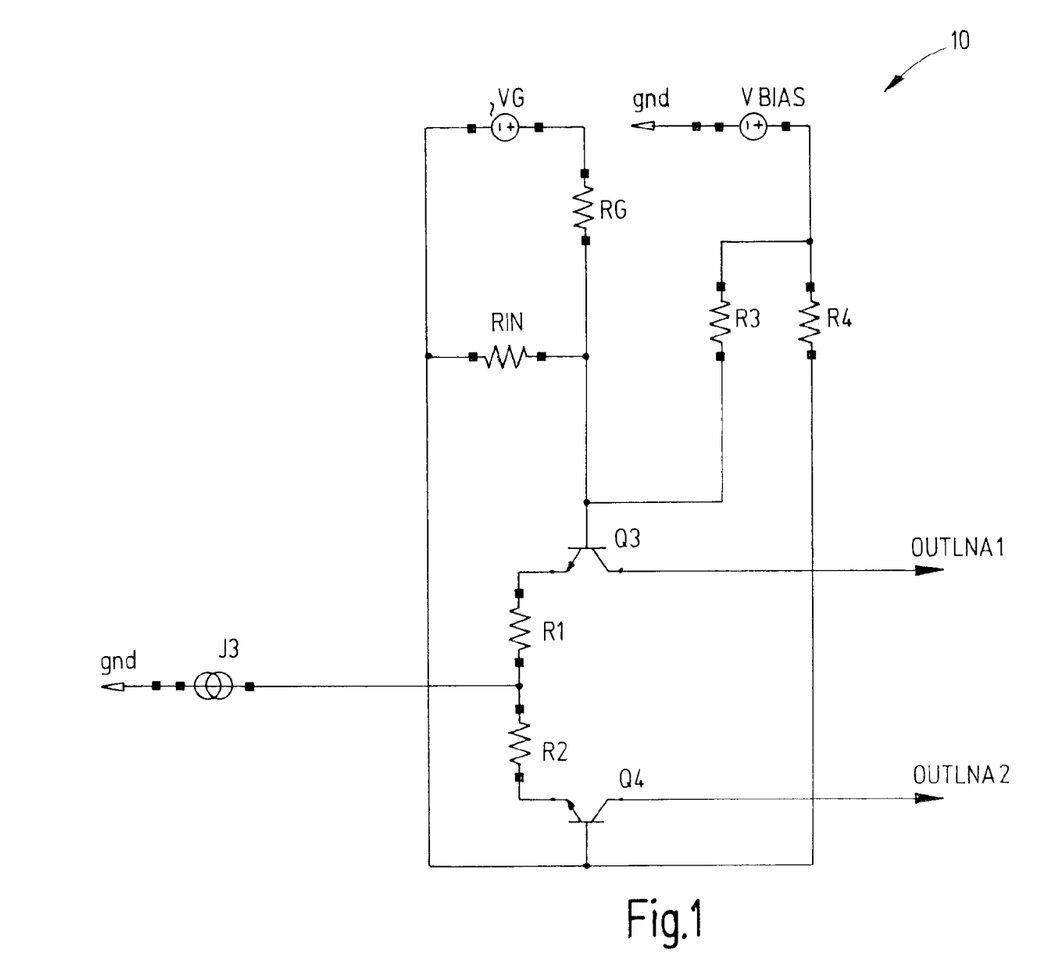
FIG. 1 gives a diagrammatic representation of a state of the art common-emitter circuit with negative current feedback.

FIG. 1 shows a circuit arrangement of a differential amplifier 10 having resistance feedback. This circuit arrangement is often used as an input amplifier. The defined internal resistance of the circuit arrangement is realized by RIN (RIN >> R3+R4). The gain and linearity are determined by the resistors R1 and R2 and by the magnitude of the current I3. Linearity rises by the value of I3, R1 and R2. In the state of the art this circuit is also referred to as a common-emitter circuit having negative current feedback. The transfer function of the arrangement I(OUTLNA1)/VG is for R1=R2=0 a tangential hyperbolic function as a result of the changing base emitter voltage when driven. The drawback of the circuit lies in the fact that RIN uses up part of the available power of the source VG and thus adds to a considerable deterioration of the noise factor.

Figure 2:
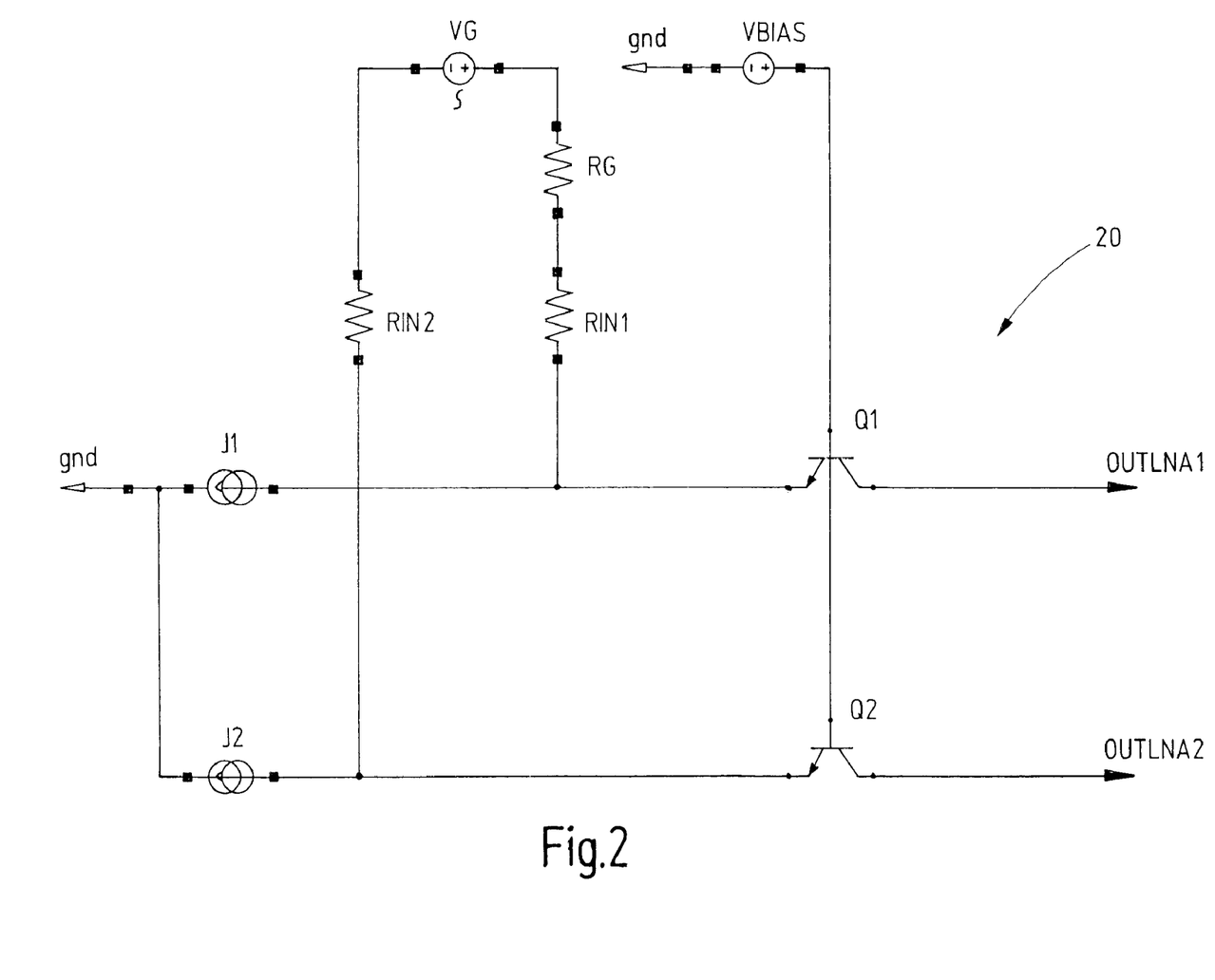
FIG. 2 shows a state of the art common-base circuit.

FIG. 2 furthermore shows a circuit 20 according to the state of the art, in which a what is called common-base circuit is realized that is used as an input amplifier circuit. The defined input resistance is predefined by the sum of RIN1 and RIN2 and the input resistance of Q1 with re1=UT/I1 and Q2 with re2=UT/I2, so that the following holds: RIN=RIN1+RIN2+UT/I1+UT/I2. The result is that the linearity increases with the increasing value of the input resistances RIN1 and RIN2 and of the currents I1 and I2. The circuit shown in FIG. 2 has a better noise factor than the circuit shown in FIG. 1, because the resistors RIN1 and RIN2 used for the realization of a defined input resistance at the same time contribute to the linearization of the transistor transfer functions of Q1 and Q2. They then have a comparable function to the two resistors R1 and R2 in the circuit shown in FIG. 1. The drawback of the circuit shown in FIG. 2 is the gain determined by the generator resistance and the input resistance, which gain in the circuit as shown in FIG. 2 is determined by I(OUTLNA1)/VG=1/(RG+RIN1+RIN2+re1+re2)=1/(RG+RIN)=½ RG with RG=RIN. This is understood to mean that by increasing I1 and I2 by re1, re2 >>RIN1, RIN2, it is possible indeed to achieve an improvement of linearity, but it is then possible to achieve only a minor increase in gain. This is detrimental especially when the subsequent circuits show a strong noise behaviour and because of a small input gain make an enhanced contribution to the total noise factor.

A further possible circuit arrangement are feedback operational amplifiers. But they often have a tendency to oscillate and to show a non-linear behaviour at high input frequencies.

U.S. Pat. No. 6,504,403 B2 discloses a low-voltage differential signal circuit in which are used two amplifier circuits which operate in a first and a second sub-range. The output of the common-emitter stage is then added to the output of the common-base stage via the D amplifier. These two stages do not have a negative feedback impedance in the emitter branches. A corresponding linearization of the transistor transfer function over a wide input voltage range is thus not possible.

US 2005/0068106 A1 discloses a low-noise amplifier circuit in which a switchable gain ratio is realized, so that for minor amplifications a different current path is made active than for large amplifications and switching between these paths takes place.

DESCRIPTION OF THE INVENTION, OBJECT, SOLUTION, ADVANTAGES

It is an object of the invention to provide a circuit arrangement which, in case of required input resistance, has a lower noise factor and better linearity and gain than in the arrangements known from the state of the art. It is then furthermore advantageous when the circuit in accordance with the invention is by far more stable or more robust than a feedback arrangement such as, for example, a feedback operational amplifier.

The object is achieved by means of a circuit arrangement of a low-noise linear input amplifier comprising a parallel circuit of a common-base circuit and a common-emitter circuit, the emitters of two first transistors are interlinked and the bases of two second transistors are intercoupled, the collectors are interconnected in parallel with the output and the source voltage is interlinked with the emitters of the second transistors and with the bases of the first transistors, and a linearization of the output current as a function of the source voltage is achieved by a linearization of the transfer function, such as the tangential hyperbolic function, of the first and second transistors.

Advantageous further embodiments of the invention are defined in the dependent claims.

BRIEF DESCRIPTION OF THE DRAWINGS

Further aspects, effects and details of the invention will be described hereinafter by means of examples of embodiment illustrated in the drawings.

PREFERRED EMBODIMENT OF THE INVENTION

Figure 3:
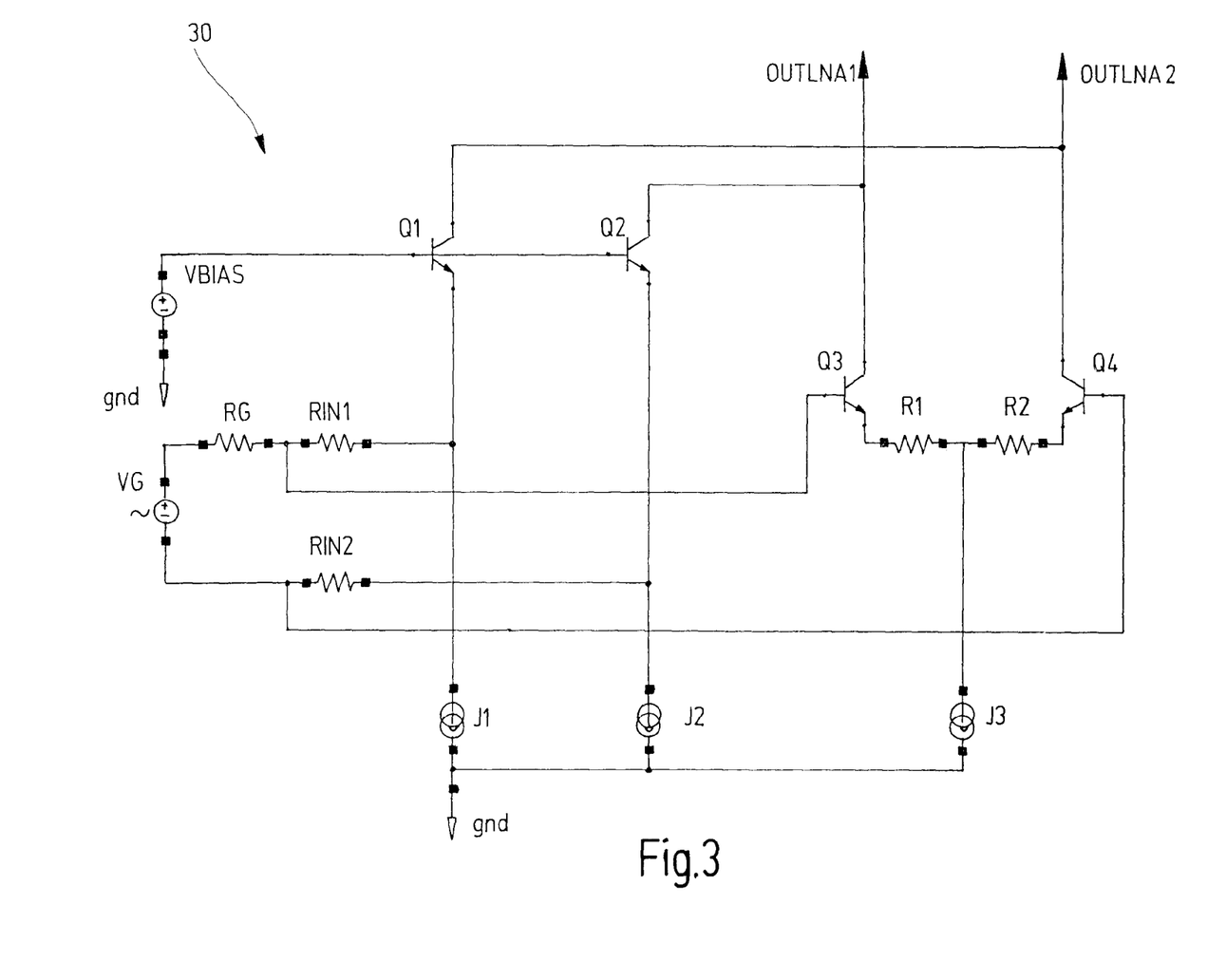
FIG. 3 shows a circuit according to the invention.

FIG. 3 shows a circuit arrangement 30 according to the invention, which stands out in that it is a special combination, such as a parallel circuit, of a common-emitter circuit and a common-base circuit of the two circuits 10, 20 as shown in FIG. 1 and in FIG. 2. The circuit 30 combines the advantages of the two circuits 10 and 20. In addition, it also offers the possibility of a complete linearization of the transistor transfer functions, such as tangential hyperbolic function tanh, of Q1, Q2, Q3 and Q4 in case of a corresponding dimensioning of the currents and resistances of the circuit over a wide input voltage range. The circuit in FIG. 3 shows in one section that the collectors of the two transistor pairs Q1, Q4 and Q2, Q3 are coupled to the respective outputs. The two emitter-coupled transistors are coupled via the resistors R1 and R2, while the other connection terminals of the resistors are connected to the current source I3. The base of transistor Q3 and transistor Q4 is coupled to either of the input resistors RIN1 and RIN2 respectively, while the base of Q3 is coupled between RG and RIN1. At the same time the emitters of Q1 and Q2 are also coupled to RIN1 and RIN2. The base of Q1 and that of Q2 are mutually coupled and are connected to the supply voltage VBIAS.

Figure 4:
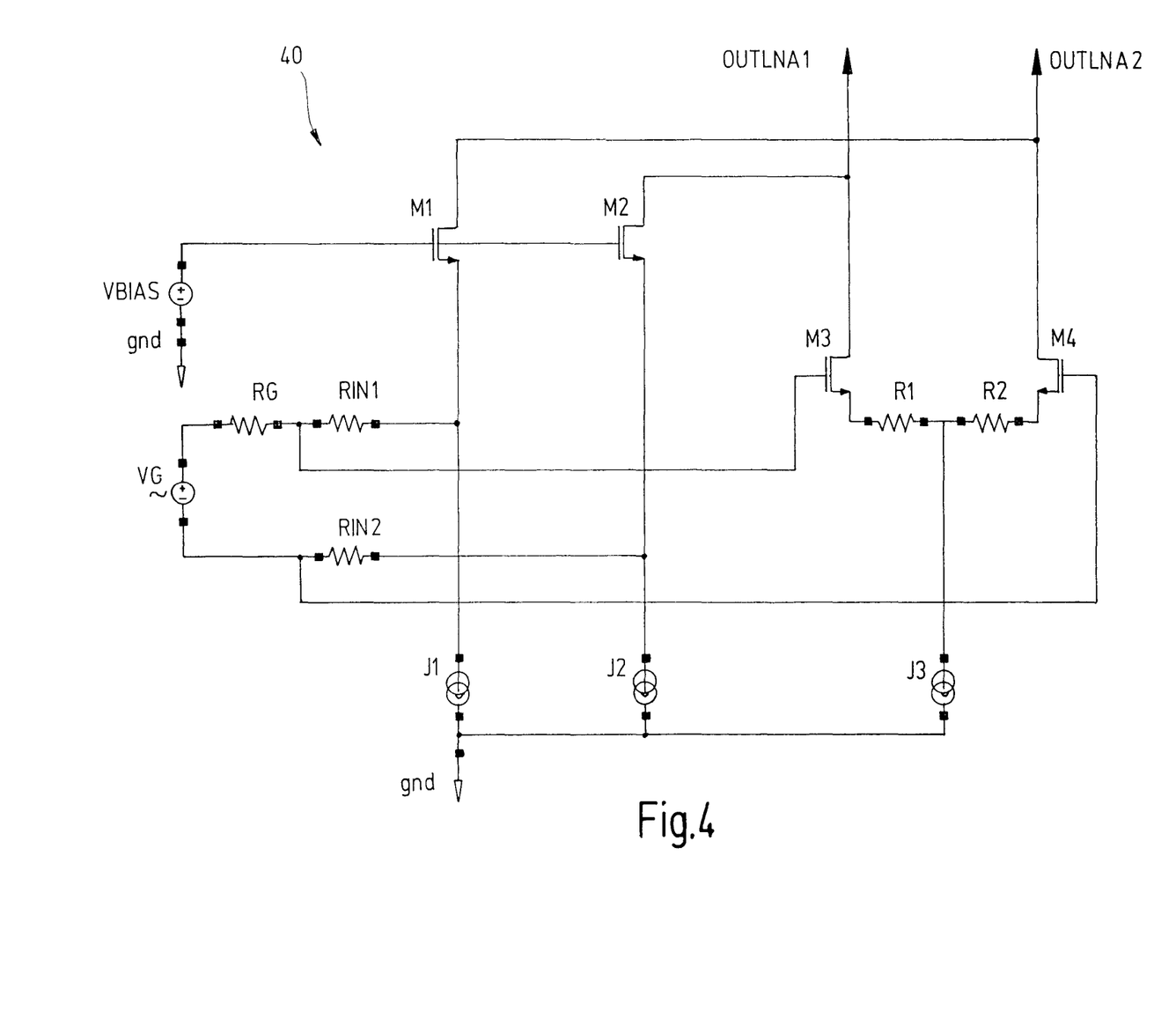
FIG. 4 shows a circuit according to the invention.

FIG. 4 shows a circuit 40 in which field effect transistors Mi are used in lieu of the bipolar transistors Qi of FIG. 3. For the rest the circuit 40 of FIG. 4 operates in corresponding fashion to the circuit 30 of FIG. 3.

The required input resistance is realized by RIN1, RIN2 and the internal resistances of the transistors Q1 and Q2 (re1=UT/I1, re2=UT/I2). At the same time, on its output side, this circuit contributes to part of the overall power gain. The circuit as it were
replaces the resistance RIN1 in FIG. 1, which at last only destroys available power and causes noise to occur at that. In order to achieve higher gain, the differential amplifier (Q3, Q4, R1, R2, I3) is connected in parallel. The input resistance is reduced by the differential amplifier only to a minor extent, because its input impedance has a very high value. The output currents (collectors Q1, Q2, Q3 and Q4) are added according to their signs shown in FIG. 3.

The AC current flowing from the terminals OUTLNA1 and OUTLNA2 includes non-linear components as a result of the tanh function of the characteristic curves of the transistors. These components which develop from the change of the base-emitter voltage UBE of the transistors, can be largely reduced in the case of a specific dimensioning of the currents and resistances of the circuit as shown in FIG. 3 or FIG. 4 respectively.

This mechanism can be qualitatively explained as follows. If the voltage VG from plus to minus increases, a current will flow into the emitter of Q1 via RG and RIN1 and flow out of the emitter of Q2 again via RIN2. As a result, the UBE of Q1 will diminish. The UBE of Q2 will then increase in equal measure. At the same time the voltage on the base of Q3 is increased and the voltage on the base of Q4 is lowered. As a result, the collector current and the UBE of Q3 are increased and the collector current and UBE of Q4 are diminished in equal measure. If one takes a mesh voltage path from the base Q3→emitter Q3→R1→R2→emitter Q4→base Q4→RIN2→emitter Q2→base Q2→base Q1→emitter Q1→RJN1→base Q3, then the terms of the change of UBE1, UBE3 and UBE2, UBE4 respectively will show up with sign inversion in the equation. Thus if the currents and resistances of the circuit of the arrangement are dimensioned such that the change of UBE1 is equal to the change of UBE3, and the change of UBE2 is equal to the change of UBE4, then the non-linear components in the output currents from the terminals OUTLNA1 and OUTLNA2 will be reduced considerably.

The following procedure may advantageously be selected for finding solutions. The generator resistance RG is a given factor. An optimal value is then selected for the input resistance, for example RIN=RG, and the currents I1 and I2 and RIN1 and RIN2 are then optimized such that the desired value is achieved. R1, R2 and I3 may be found, for example, by means of "iterative simulation" with a simulator.

Figure 5:
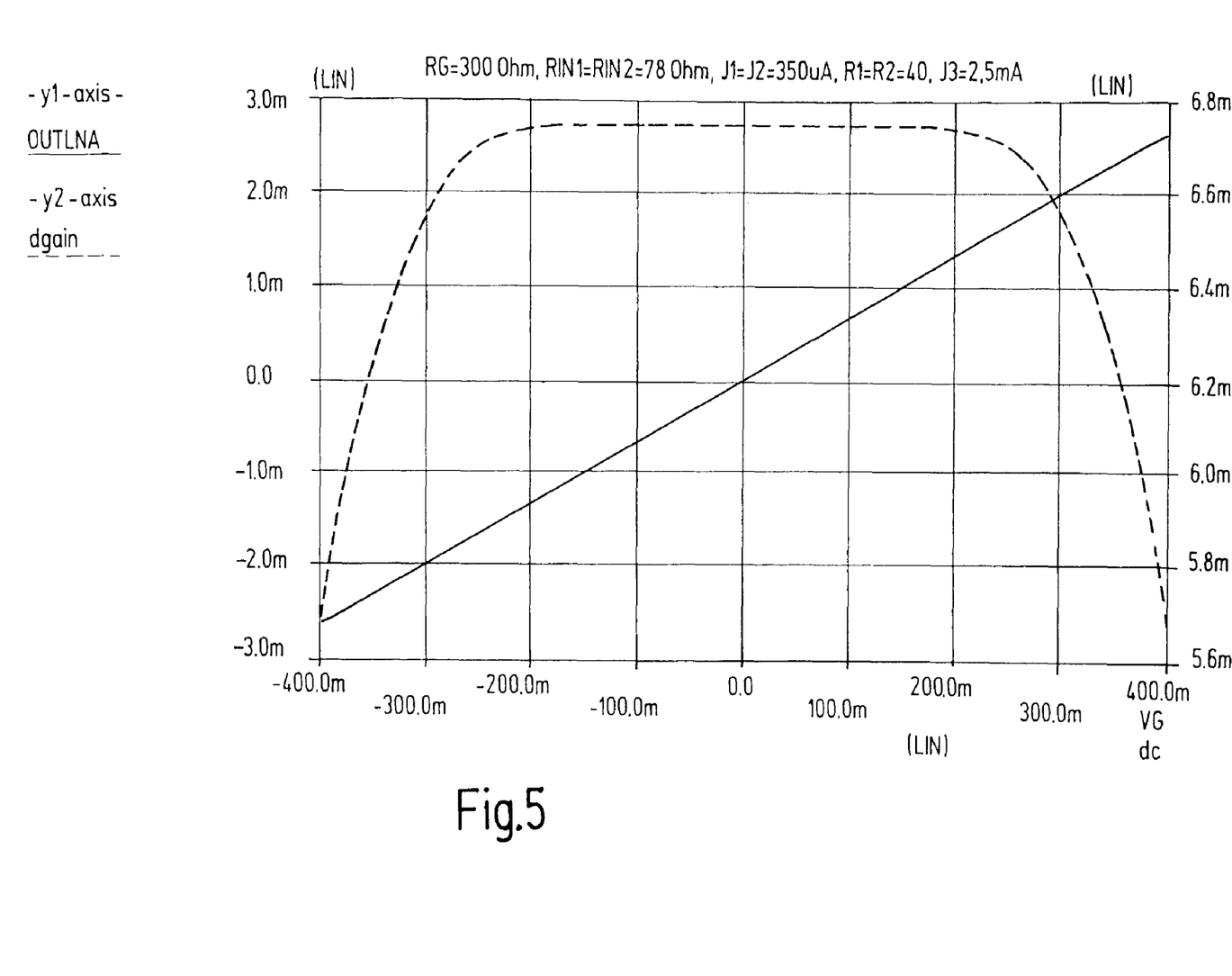
FIG. 5 gives a representation of a diagram.
Figure 6:
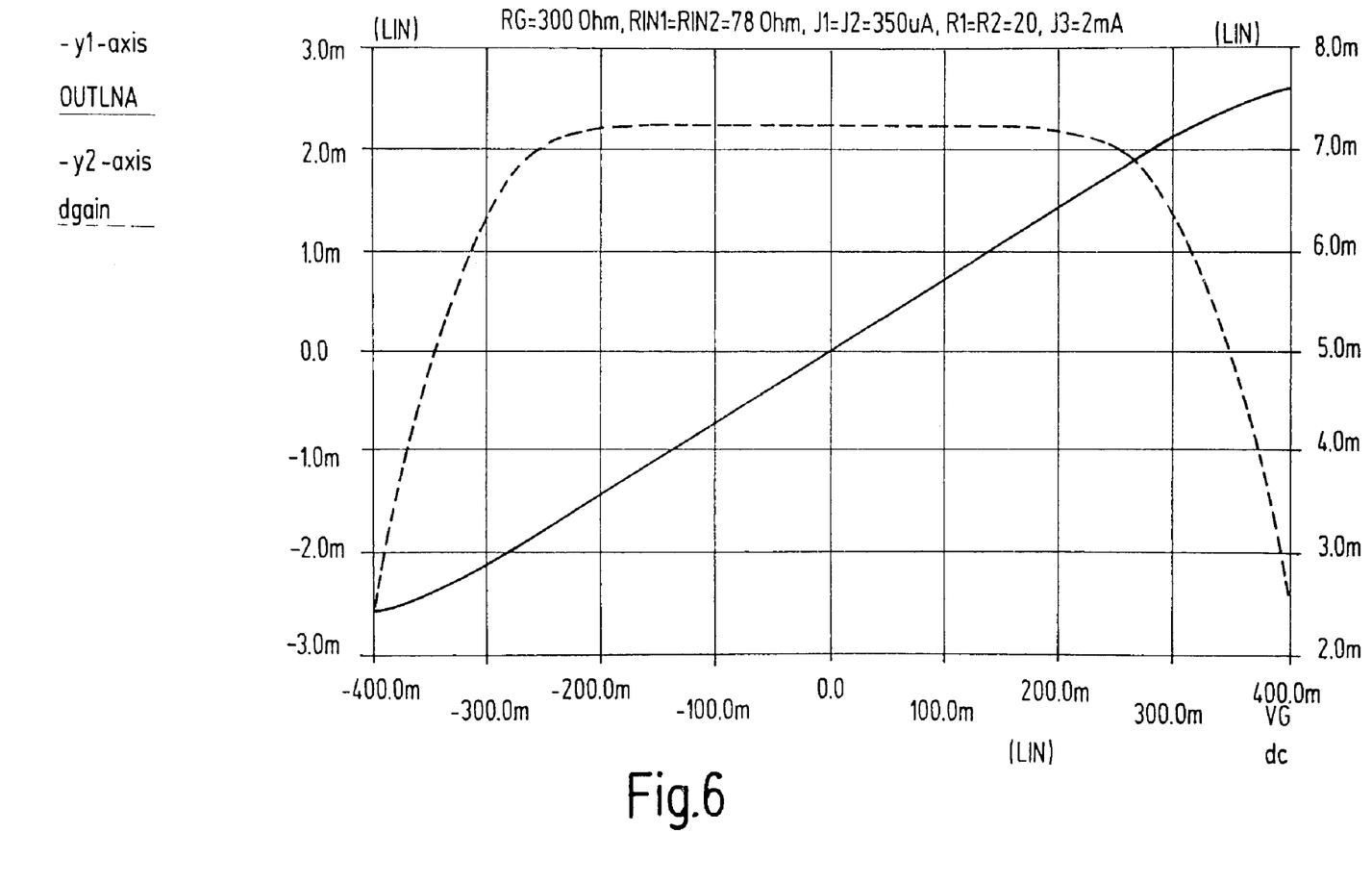
FIG. 6 gives a representation of a diagram.

FIG. 5 and FIG. 6 show diagrams with possible solutions for RG=300 Ohms. FIGS. 5 and 6 each show curves dgain and OUTLNA as a function of VG. The curve dgain is then the derivation dOUTLNA/dVG. In the range where dgain is constant, the transfer function OUTLNA=OUTLNA1-OUTLNA2 is very linear. The resistances RIN1, RIN2, R1 and R2 may also adopt the value of zero. In that case the extent of maximum control is smallest.

The linerization can also be achieved with field effect (MOS) transistors, cf. FIG. 4. The values of the resistances and currents in a circuit as shown in FIG. 4 are then different, it is true, from the values in a circuit as shown in FIG. 3, because MOS transistors Mi present a mathematically different behaviour from bipolar transistors Qi.

The diagrams of the two FIGS. 5 and 6 are also different from each other in that in FIG. 5 the curves were calculated in accordance with the example shown in FIG. 3, where the resistances R1 and R2 of 20 Ohms are smaller than in the example of FIG. 6 of 40 Ohms. Also I3 with 2.0 mA and 2.5 mA respectively has been selected to be different. Further, Rg with 300 Ohms has been taken as an example. Furthermore, I1 and I2 in FIG. 5 are predefined. RIN1 and RIN2 result from RIN=RG. It is also possible for RIN1 and RIN2 to be predefined and for I1 and I2 to be calculated therefrom. Subsequently, R1 and R2 have been predefined and the current I3 was varied for such a period of time until the output function is linear. In a further example of embodiment it is also possible for I3 to be predefined and subsequently, for R1, R2 to be varied.

For predefined values of I1, I2 and RIN1, RIN2 and Rg one will always find a solution to R1, R2 and I3. But it may also be the case that for predefined values RG, RIN1, RIN2 and R1, R2 the current I3 becomes disproportionally large for linearization. In that case, however, the predefined values may be modified.

In FIG. 6 compared to FIG. 5 R1 and R2 are set to 200 Ohms in order to achieve a larger gain. The current I3 is then simulated at 2 mA.

Figure 7:
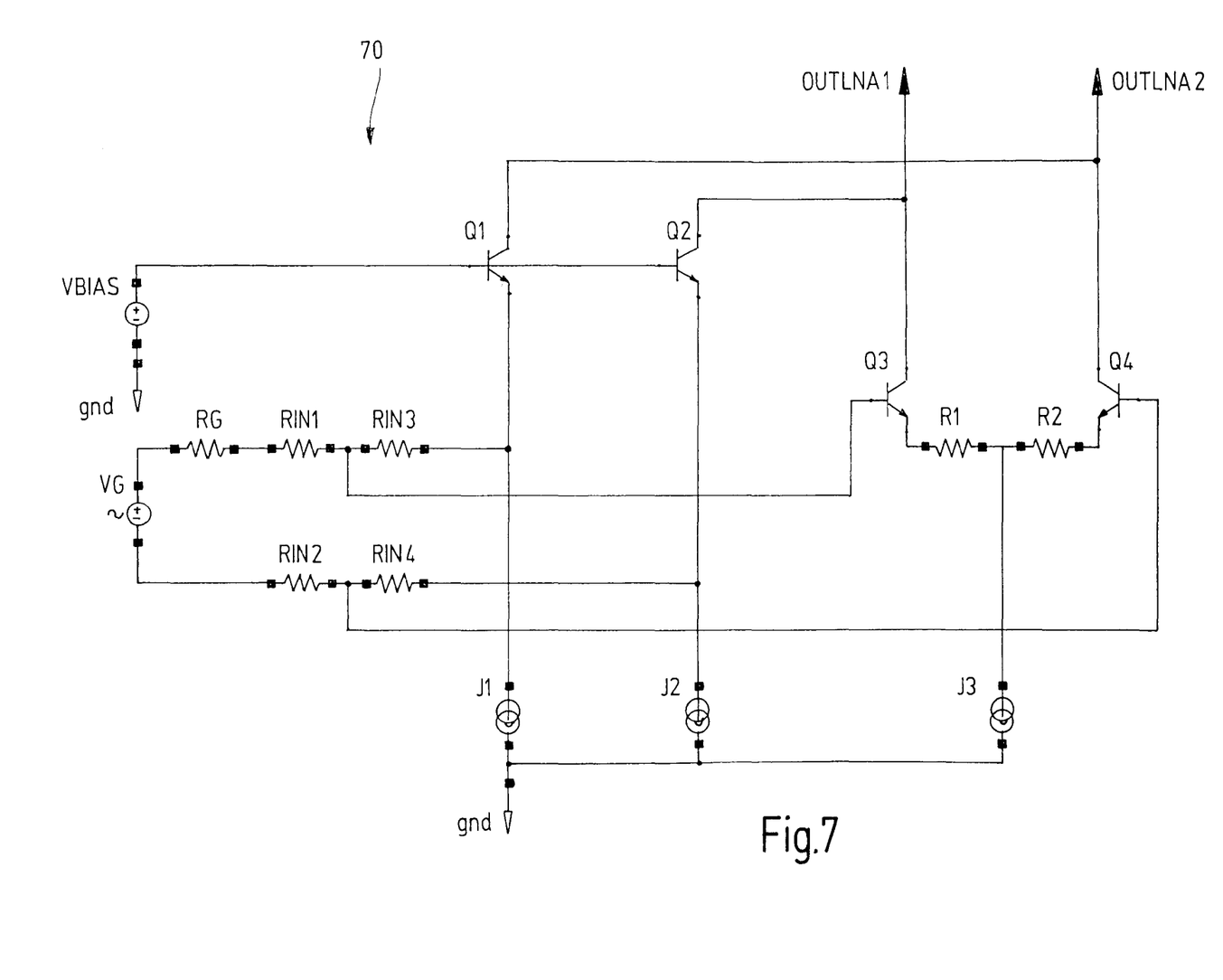
FIG. 7 shows a circuit according to the invention.

FIG. 7 shows a further advantageous example of embodiment of the invention. In the circuit 70 according to FIG. 7 the resistors RIN1 and RIN2, as they are used in FIG. 3, are replaced by resistors RIN1+RIN3 and RIN2+RIN4 respectively, and the bases of the transistors Q3 and Q4 as shown in FIG. 7 are connected between the two resistors RIN1, RIN3 and RIN2, RIN4 respectively.

In accordance with the example shown in FIG. 5 the resistances RIN1 and RIN3 (and RIN2 and RIN4) could for example be selected each to be 39 Ohms. The values for R1, R2 and I3 will then, however, be different from those shown in FIG. 5. But in any case a solution to a linearized output current can be found. The lowest noise factor is obtained for the arrangement shown in FIG. 3 and a comparably slightly more adverse effect on the noise factor is shown in FIG. 7 with RIN3=RIN4=0 and RIN1, RIN2 (FIG. 7)=RIN1, RIN2 (FIG. 3). But it is also possible to obtain intermediate values.

Figure 8:
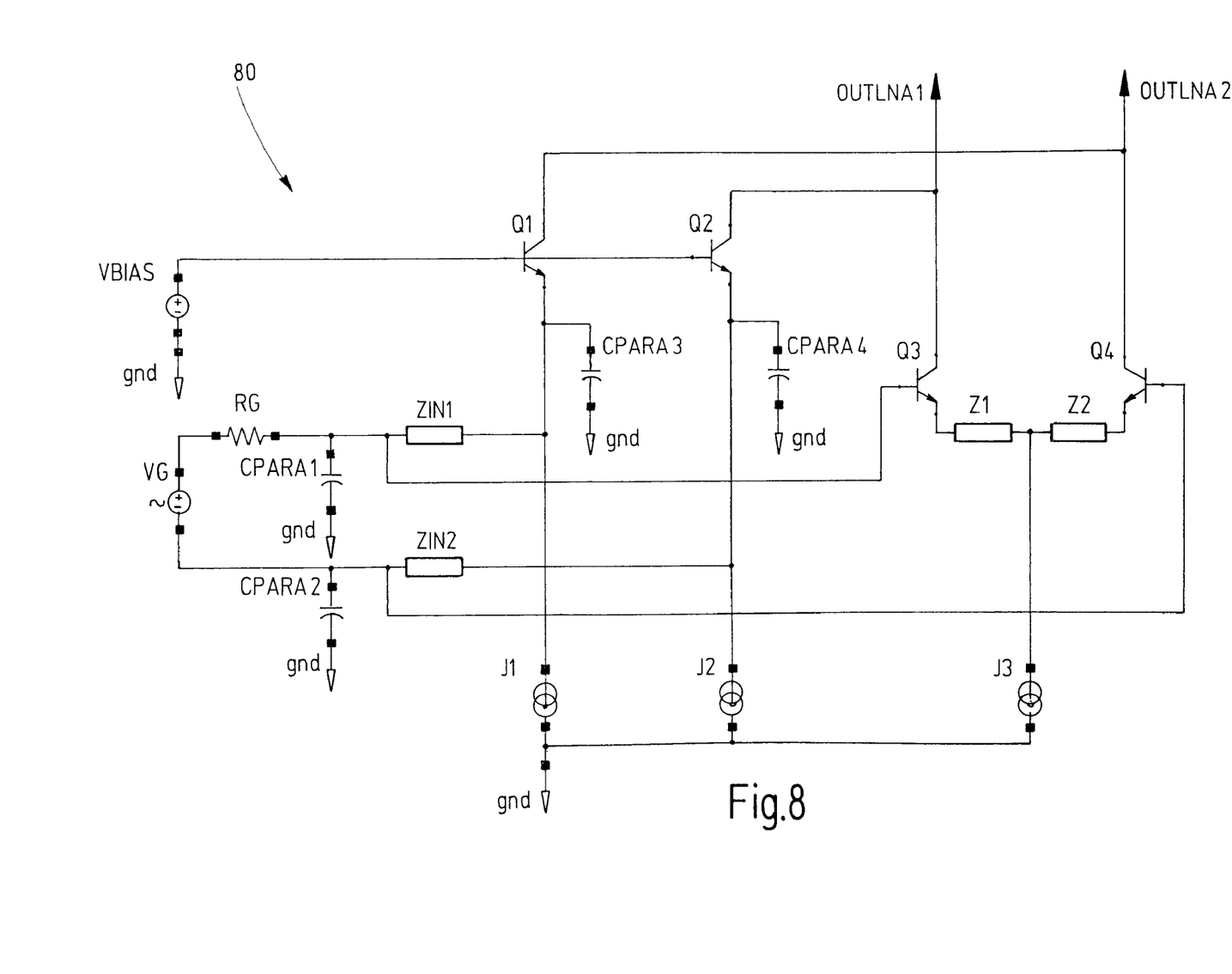
FIG. 8 shows a circuit according to the invention.

FIG. 8 further shows a general embodiment of a circuit 80 as invented as it is realized for example for very high input frequencies, for example, in the gigahertz domain. In this case the parasitic capacitances of the bondpads and the capacitive input impedance CPARA1,2 of Q3 and Q4 and the parasitic capacitances CPARA3,4 of Q1 and Q2 and of the current sources I1 and I3 are incorporated. In order to obtain a real input impedance, the impedances ZIN1,2 and Z1,2 are advantageously a series connection of resistor and coil, so as to counterbalance the capacitive part. Accordingly, parasitic impedances CPARA1,2,3 and 4 are taken into consideration in circuit 80. The parasitic impedances are shown connected to ground gnd.

Figure 9:
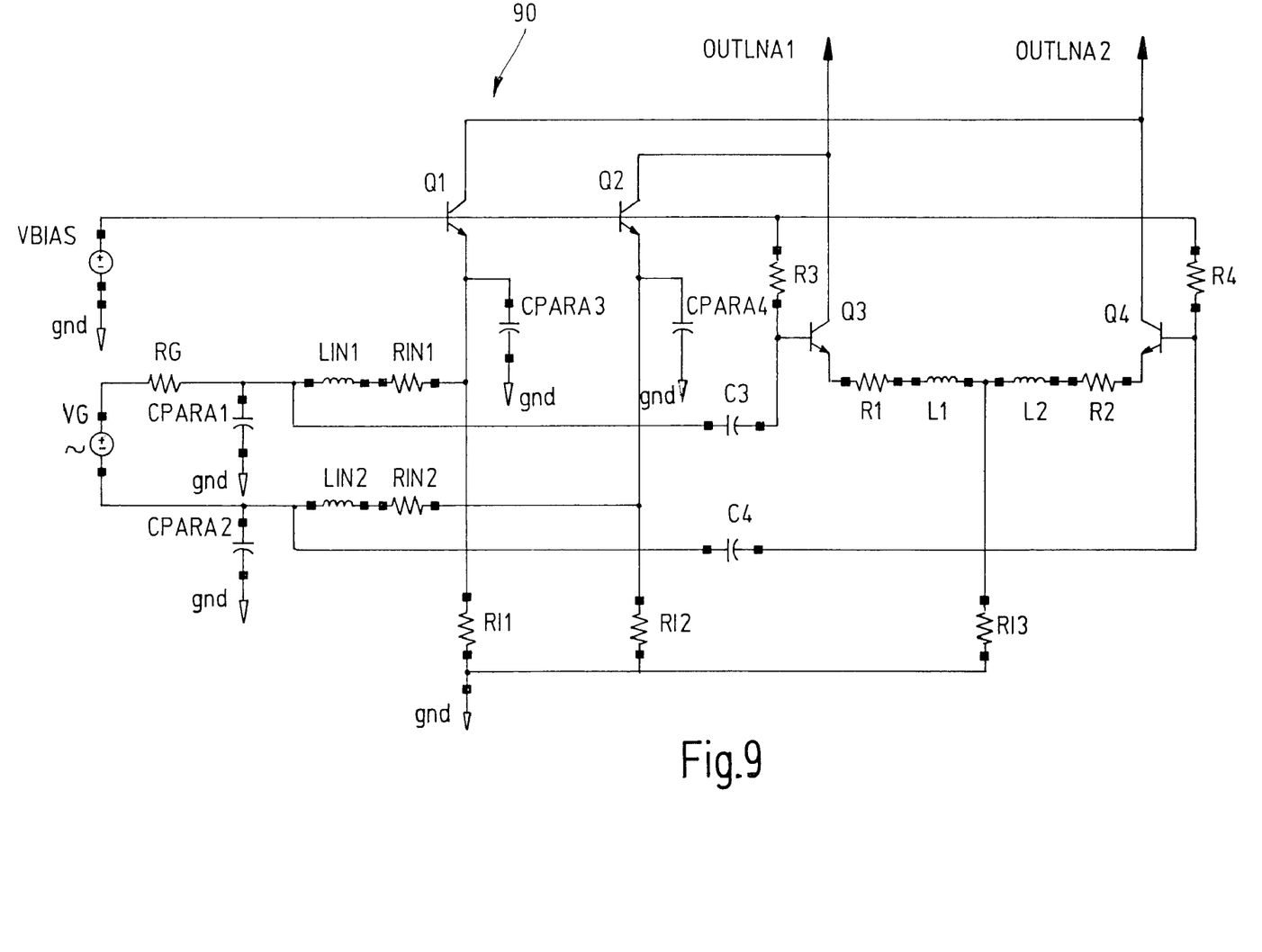
FIG. 9 shows a circuit according to the invention.

FIG. 9 further shows an embodiment of a circuit 90 according to the invention. The bases of Q3 and Q4 are coupled to the input and the voltage VBIAS via a high-pass filter R3, C3 and R4, C4 respectively, having a cut-off frequency that is by far smaller than the receiving frequency. The emitter voltage of Q3 and Q4 is in this case only one UBE (about 850 mV) below VBIAS. In the circuits shown in FIGS. 3, 7 and 8 this voltage is two UBE below VBIAS. The arrangement as shown in FIG. 9 is better suited for smaller supply voltages. The impedances ZIN1,2 and Z1,2 of FIG. 8 are replaced by resistors and coils LIN1, LIN2, L1, L2 in FIG. 9; the currents I1,2,3 by the resistors RI1,2,3.

In the FIGS. 7, 8 and 9 the bipolar transistors may also be replaced by field effect transistors and achieve a high degree of linearization of the output current by corresponding dimensioning of the impedances Z1, Z2 and of the current I3 by means of a simulator.

Thus the invention makes it possible to provide low-noise, linear preliminary stages with little power consumption for low supply voltages. Since they consist of simple circuit arrangements, they are highly robust and as a chip need to have only little chip surface.

The circuits according to the invention can advantageously be used in analogue receivers for digital signals, such as, for example at 2.3 GHz, like the arrangement shown in FIG. 9 or at 250 MHz according to an arrangement as shown in FIG. 9 without coils, or FIG. 3. For both frequencies external intermediate frequency (IF) filters may be used, which provides the necessary generator resistance. The circuits are advantageously integrated in integrated circuits (IC).

CAPTIONS TO THE DRAWINGS 10 circuit
20 circuit
30 circuit
40 circuit
70 circuit
80 circuit
90 circuit
gnd ground
VG generator voltage
VBIAS supply voltage
RG generator resistance
RIN input resistance
RIN1 input resistance
RIN2 input resistance
RIN3 input resistance
RIN4 input resistance
R1 resistor
R2 resistor
R3 resistor
R4 resistor
Q1 transistor
Q2 transistor
Q3 transistor
Q4 transistor
M1 MOS transistor
M2 MOS transistor
M3 MOS transistor
M4 MOS transistor
I1 current
I2 current
I3 current
OUTLNA1 output voltage
OUTLNA2 output voltage
CPARA1 parasitic capacitance
CPARA2 parasitic capacitance
CPARA3 parasitic capacitance
CPARA4 parasitic capacitance
Z1 impedance
Z2 impedance
ZIN1 input impedance
ZIN2 input impedance
LIN1 input coil
LIN2 input coil
L1 coil
L2 coil
RI1 resistor
RI2 resistor
RI3 resistor

The invention claimed is:

1. A circuit arrangement of a low-noise linear input amplifier, comprising:
    a parallel circuit of a common-base circuit having a pair of common-base circuit transistors with intercoupled bases; and
    a common-emitter circuit having a pair of common-emitter circuit transistors, in which the emitters of the common-emitter circuit transistors are interlinked, and
    wherein the respective collectors of the common-base circuit transistors and of the common-emitter circuit transistors are interconnected in parallel with an output and a source voltage is interlinked with the emitters of the common-base circuit transistors and with the bases of the common-emitter circuit transistors,
    wherein a linearization of the output current at the output as a function of the source voltage, is achieved by a linearization of the transfer function of the common-emitter circuit transistors and of the common-base circuit transistors.

2. The circuit arrangement according to claim 1, wherein linearization of the transfer function is achieved by dimensioning of at least one of currents, resistors, impedances, capacitors and coils of the circuit.

3. The circuit arrangement according to claim 1, wherein input resistance to the arrangement is predefined as a result of resistances and internal resistances of at least one of the transistors.

4. The circuit arrangement according to claim 1, wherein at least two of the transistors are MOS transistors.

5. The circuit arrangement according to claim 1, wherein input resistances to the arrangement include a series circuit of resistors.

6. The circuit arrangement according to claim 1, characterized in that input resistances to the arrangement are realized as by a circuit that provides impedances.

7. The circuit arrangement according to claim 6, wherein the input resistances are realized as resistor coil circuits.

8. The circuit arrangement according to claim 6, wherein parasitic capacitances are taken into account in terms of the choice of the impedances or additional capacitors.

9. The circuit arrangement according to claim 1, wherein the linearization takes place in such a way that at least one of the transistors is dimensioned such that the base-emitter voltages of the transistors are selected such that the change of a base-emitter voltage of one common-emitter circuit transistor is equal to the change of a base-emitter voltage of one common-base circuit transistor.

* * * * *